United States Patent [19]
Katsuta

[11] Patent Number: 5,349,586
[45] Date of Patent: Sep. 20, 1994

[54] STAND BY CONTROL CIRCUIT

[75] Inventor: Hiroshi Katsuta, Tokyo, Japan

[73] Assignee: NEC Corporation, Tokyo, Japan

[21] Appl. No.: 781,008

[22] Filed: Oct. 17, 1991

[30] Foreign Application Priority Data

Oct. 17, 1990 [JP] Japan .................. 2-278268

[51] Int. Cl.[5] .......................................... G01R 31/318
[52] U.S. Cl. ..................... 371/22.1; 365/226;
365/227; 365/229; 364/273.1; 364/948.8;
364/DIG. 1
[58] Field of Search ............... 365/227, 229, 189.09,
365/226; 371/15.1, 22.1; 307/272.3; 364/273.1,
948.8; 395/575

[56] References Cited

U.S. PATENT DOCUMENTS

| | | | |
|---|---|---|---|
| 3,680,061 | 7/1972 | Arbab et al. | 365/227 |
| 4,120,047 | 10/1978 | Varadi | 365/227 |
| 4,275,312 | 6/1981 | Saitou et al. | 365/227 |
| 4,788,454 | 11/1988 | Tanagawa et al. | 307/272.3 |
| 4,906,862 | 3/1990 | Itano et al. | 365/227 |
| 4,933,902 | 6/1990 | Yamada et al. | 307/272.3 |
| 4,945,300 | 7/1990 | Sato et al. | 365/227 |
| 4,999,519 | 3/1991 | Kitsukawa et al. | 365/227 |
| 5,073,874 | 12/1991 | Yamada et al. | 365/227 |
| 5,103,167 | 4/1992 | Okano et al. | 371/22.1 |
| 5,136,181 | 8/1992 | Yukawa | 307/272.3 |
| 5,140,557 | 8/1992 | Yoshida | 365/227 |
| 5,208,781 | 5/1993 | Matsushima | 365/227 |

Primary Examiner—Robert W. Beausoliel, Jr.
Assistant Examiner—Phillip F. Vales
Attorney, Agent, or Firm—Whitham, Curtis, Whitham & McGinn

[57] ABSTRACT

A stand-by control circuit includes a power ON detecting circuit which supplies a flag with a power ON detecting signal to be reset. In a testing mode, the power ON detecting circuit shuts off a current flowing therethrough, so that testing of LSIs each including the stand-by control circuit can be carried out without errors.

2 Claims, 3 Drawing Sheets

STAND BY CONTROL CIRCUIT

FIELD OF THE INVENTION

This invention relates to a stand-by control circuit and, more particularly, to a stand-by control circuit for controlling a low power consumption operation mode, called a stand-by mode, of a microcomputer.

BACKGROUND OF THE INVENTION

In recent years, microcomputers have been applied to machines such as office automation machines. Microcomputers used in such machines are required to have low power consumption, because the machines are applied with a power supply from batteries such machines being of small size and light weight.

In order to achieve low power consumption, microcomputers are programmed to operate with low power consumption mode called a "stand-by mode". In the stand-by mode, the microcomputer halts its processing operation while maintaining information of internal states of the microcomputer in registers, flags, RAMs, etc. The microcomputer goes into the stand-by mode by carrying out a stand-by control command, and is released from the stand-by mode by receiving a system reset signal.

A conventional stand-by control circuit for controlling stand-by mode operation of a microcomputer includes a stand-by flag of a set/reset type flip-flop, a power ON detecting circuit which supplies a power ON detecting signal to a reset input terminal of the stand-by flag, an AND gate which has two input terminals supplied with a writing signal and a signal of a bus line, and a bus driver which is supplied with an output signal of the stand-by flag and controlled by a reading signal to supply a stand-by signal to the bus line. The power ON detecting circuit usually includes a transistor which is maintained to be in the ON state.

In operation, when the power supply voltage is applied to the microcomputer including the stand-by control circuit, the power ON detecting circuit detects the power ON state and the power ON detecting signal becomes active and is supplied to the stand-by flag to be reset. The stand-by flag is set when the AND gate supplies a set signal of logic level "1" on condition that the writing signal is active and the bus line is a high level. An output signal of the stand-by flag is supplied to the bus line through the bus driver when a reading signal supplied to the bus driver becomes active. The power ON detecting signal supplied from the power ON, detecting circuit becomes active, just after the power supply is turned on and remains active until the power supply voltage becomes as high as the inversion level. Then, the power ON detecting signal becomes inactive. In such operation, a constant current flows through the transistor which is maintained at an ON state in the power ON detecting circuit.

In this conventional stand-by control circuit, the stand-by flag is controlled to be at a set state, when a system is reset after the release of the stand-by mode, while the stand-by flag is controlled to be at a reset state, when the system is reset by turning a power supply on, so that the two reset states of the system are easily distinguished.

According to the conventional stand-by control circuit, however, there is a disadvantage in that it is difficult to sort out microcomputers having current leakage of several $\mu A$ which are thereby determined to be defective in testing microcomputers, because a constant current of several $\mu A$ flows constantly through the power ON detecting circuit. The current leakage of several $\mu A$ is included at the normal temperature by junction current leakage, sub-threshold current leakage, etc.. In order to overcome such a disadvantage, testing is carried out under a high temperature to increase the leakage currents to the level as large as some tens of $\mu A$. In this testing method, however, there is another disadvantage in that process of the testing becomes complicated, so that an advantage of LSIs of low cost may not be realized.

SUMMARY OF THE INVENTION

Accordingly, it is an object of the invention to provide a stand-by control circuit in which a constant current flowing in a power ON detecting circuit can be eliminated.

It is a further object of the invention to provide a stand-by control circuit, by which a defective microcomputer is easily detected.

According to a feature of the invention, stand-by control circuit comprises:

means for detecting a state of a power supply;

a flag which is reset by a power ON detecting signal supplied from the detecting means;

wherein the detecting means comprises means for shutting off a current flowing through the detecting means during a testing mode carried out in accordance with a testing signal.

BRIEF DESCRIPTION OF THE DRAWINGS

The invention will be explained in more detail in conjunction with appended drawings wherein.

DESCRIPTION OF THE PREFERRED EMBODIMENTS

Figure 1:
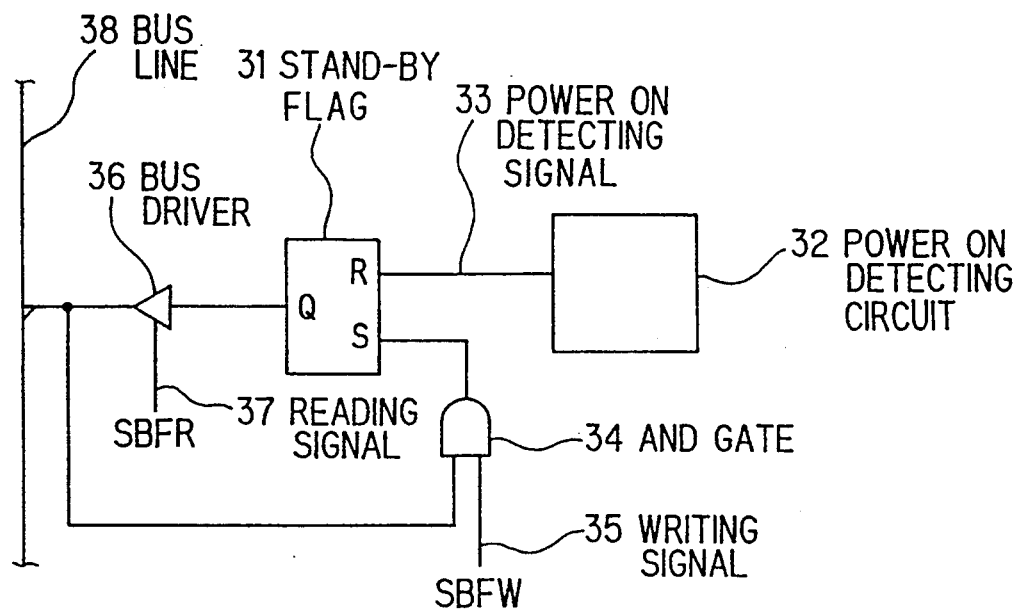
FIG. 1 is a block diagram illustrating a conventional stand-by control circuit.

Before describing a stand-by control circuit in preferred embodiments according to the invention, the conventional stand-by control circuit described before will be explained in conjunction with FIG. 1.

The conventional stand-by control circuit includes a stand-by flag 31 of a set/reset type flip-flop, a power ON detecting circuit 32 which supplies a power ON detecting signal 88 to a reset input terminal of the stand-by flag 31, an AND gate 34 which has two input terminals supplied with a stand-by flag writing signal (SBFW) 35 and a signal of a bus line 38, and a bus driver 86 which is supplied with an output signal of the stand-by flag 31 and controlled by a stand-by flag reading signal (SBFR) 37 to supply a stand-by signal to the bus line 38. The power ON detecting circuit 32 usually includes a transistor lo which is maintained to be in the ON state.

In operation, when the power voltage is applied to the microcomputer including the stand-by control circuit, the power ON detecting circuit 32 detects the power ON state to supply a power ON detecting signal to the stand-by flag 31 which is thereby reset. Thus, the power ON reset is realized. On the other hand, the stand-by flag 31 is set when the AND gate 34 supplies a set signal of logic level "1" on condition that the writing signal 35 is active and the bus line 38 is high level. An output signal of the stand-by flag 31 is supplied to the bus line 38 through the bus driver 36 when a reading signal 37 supplied to the bus driver 36 becomes active.

The power ON detecting signal 33 supplied from the power ON detecting circuit 32 becomes active in accordance with the change of a logic threshold voltage at the time of turning the power supply ON, just after the power supply is turned on, and the power ON detecting signal 33 becomes inactive, when the power supply voltage becomes as high as the inversion level. A constant current flows through the transistor in the constantly ON state in the power ON detecting circuit 32.

Figure 2:
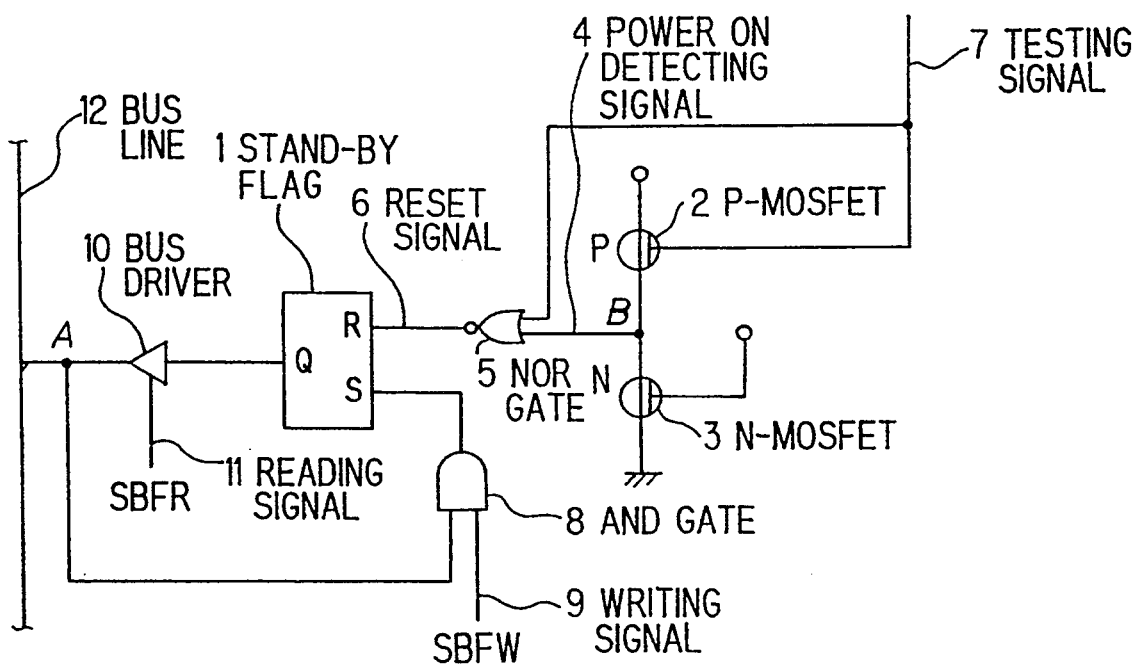
FIG. 2 is a block diagram illustrating a stand-by control circuit in a first preferred embodiment according to the invention.

Next, a stand-by control circuit in a first preferred embodiment will be explained. As shown in FIG. 2, the stand-by control circuit includes a stand-by flag 1 of a set/reset type flip-flop, a P-MOSFET 2, an N-MOSFET 3, a NOR gate 5, an AND gate and a bus driver 10. The P-MOSFET 2 i s connected at gate to a testing signal line 7, at a source to power supply level, and at a drain to a nodal point B. The N-MOSFET 3 is connected at a gate to the power supply level, at a source to ground, and at a drain to the nodal point B. The NOR gate 5 is connected at two input terminals to the testing signal line 7 and the nodal point B, and at an output terminal to a reset terminal of the stand-by flag 1. The AND gate 8 is connected at two input terminals to a writing signal line 9 and a nodal point A. The stand-by flag 1 is connected at an output terminal to an input terminal of the bus driver 10. The bus driver 10 is connected at a control terminal to a reading signal line 11 and at an output terminal to the nodal point A.

Figure 3:
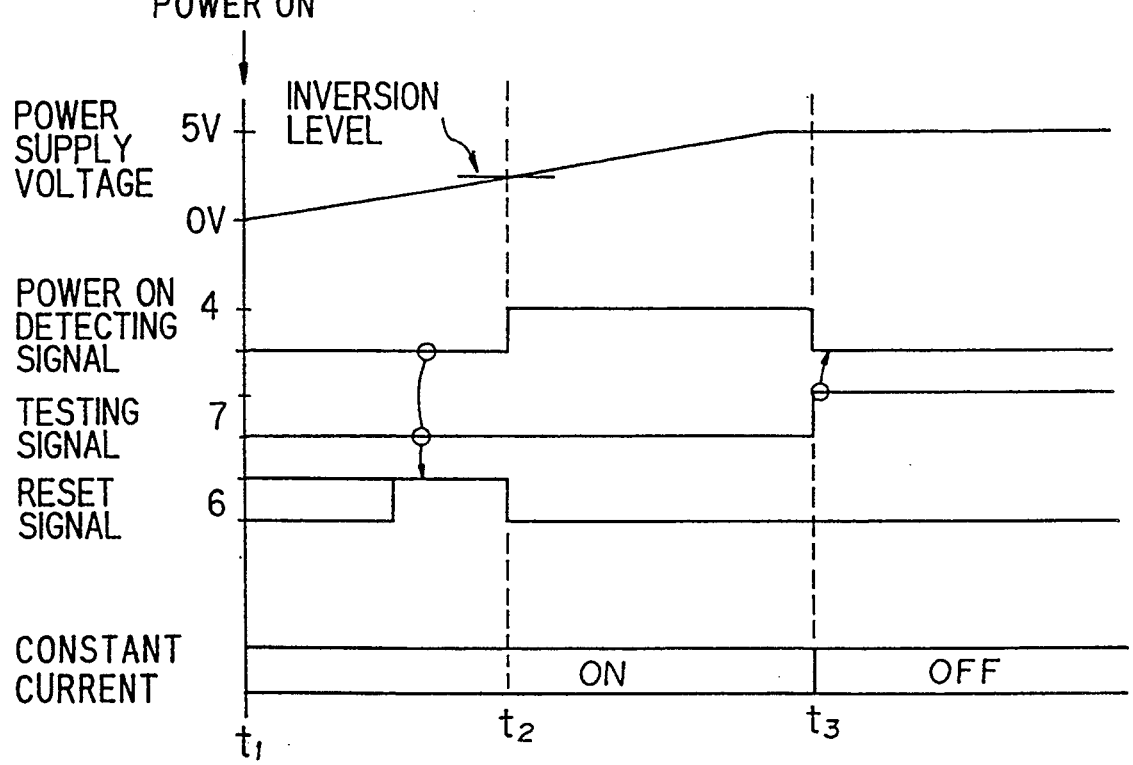
FIG. 3 is a timing chart explaining operation of the stand-by control circuit in the first preferred embodiment according to the invention.

Next, operation of the stand-by control circuit in the first preferred embodiment will be explained in conjunction with FIG. 3. Normally, the testing signal is inactive, so that the P-MOSFET 2 is in the ON state. In such a state, when the power supply i s turned on ( time t, ), so that the power supply voltage increases gradually, as shown in FIG. 3, and the N-MOSFET 3 is turned on. The power ON detecting signal level which is a voltage level of the nodal point B is maintained to be low level until the power supply voltage becomes the inversion level. Therefore, the NOR gate 5 is supplied with two low level input signals, so that the NOR gate 5 supplies a high level signal to the reset terminal of the stand-by flag 1 to be reset. When the power supply voltage increases to be the inversion level, the power ON detecting signal becomes a high level (time $t_2$), so that the NOR gate 5 supplies a low level signal to the stand-by flag 1. On the other hand, the stand-by flag 1 is set when the AND gate 8 supplies a set signal of logic level "1" on condition that the stand-by flag writing signal (SBFW) 9 is active and the bus line 12 is at a high level. An output signal of the stand-by flag 1 is supplied to the bus line 12 through the bus driver 10 when a stand-by flag reading signal (SBFR) 11 supplied to the bus driver 10 becomes active. During the times $t_1$ to $t_8$, a constant current flows through the P- and N-MSFETs 2 and 3.

When the microcomputer is going to be tested, the testing signal is set to be high (time $t_3$), so that the P-MOSFET 2 is turned OFF. Therefore, no current flows through the P-MOSFET 2 and the N-MOSFET 3, and the power ON detecting signal becomes a low level. The NOR gate 5 is supplied with a high level, so that it supplies the reset terminal of the stand-by flag with a low level signal. After the time $t_5$, no constant current flows through the P- and N-MOSFETs 2 and 3.

The testing signal may be supplied from an external terminal of the microcomputer, or it may be supplied form a testing mode changing circuit provided in the microcomputer.

Figure 4:
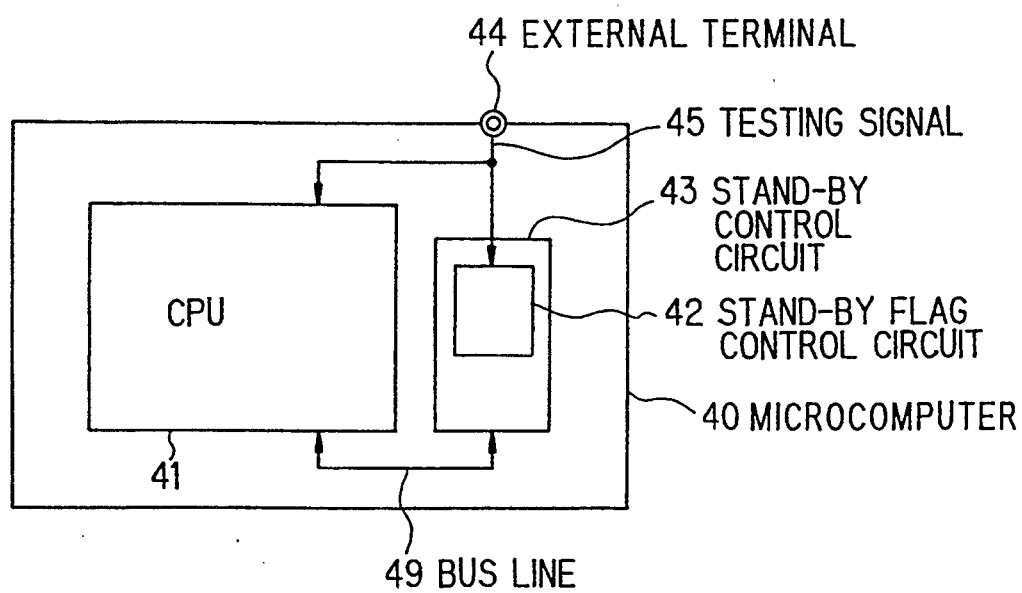
FIG. 4 is a block diagram illustrating a microcomputer including the stand-by control circuit in the first preferred embodiment according to the invention.

FIG. 4 shows a microcomputer 40 including the stand-by control circuit in the first preferred embodiment. In the microcomputer 40, a stand-by flag control circuit 42 which is included in the stand-by control circuit 43 is supplied with a testing signal 45 through an external terminal 44 of the microcomputer 40. A CPU 41 of the microcomputer 40 and the stand-by control circuit 43 are connected to each other by a bus line 49. The CPU 41 is also supplied with the testing signal 45.

The microcomputer 40 has a testing mode as well as an ordinary operation mode for operating command processes. Switching of the two modes are determined by the testing signal 45 which is determined by an input logic level of the external terminal 44. The ordinary operation mode is selected when the input logic level thereof is "0", and the testing mode is selected when the input logic level thereof is "1".

In the microcomputer explained above, the testing signal 45 is supplied directly from the external terminal 44, however, the testing signal 45 may be supplied from a register for storing a data determining a testing mode in the microcomputer 40.

Figure 5:
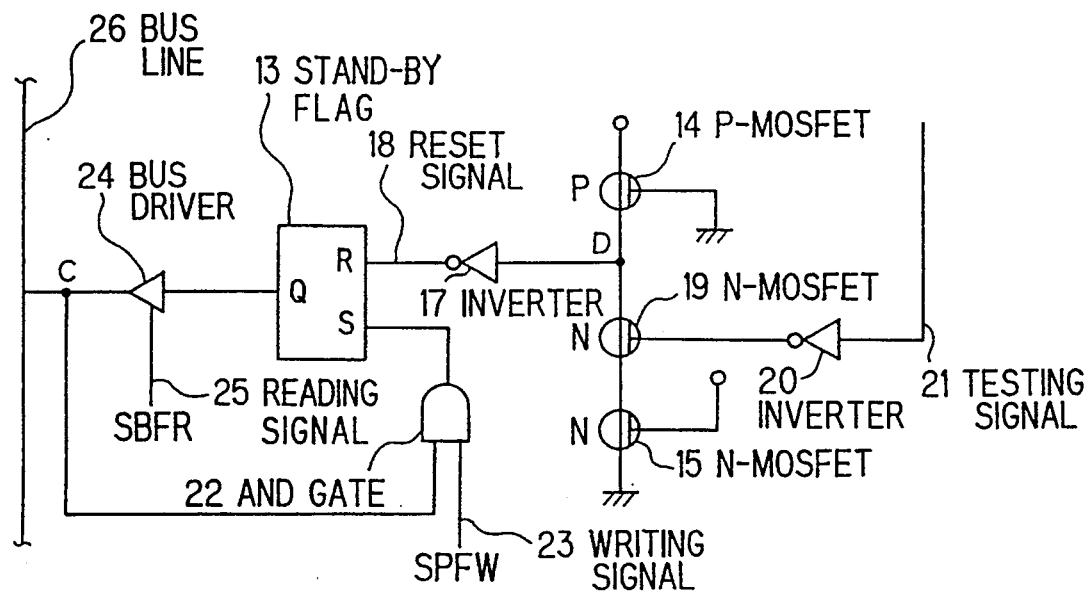
FIG. 5 is a block diagram illustrating a stand-by control circuit in a second preferred embodiment according to the invention.

Next, a stand-by control circuit in a second preferred embodiment will be explained. As shown in FIG. 5, the stand-by control circuit includes a standby flag 13 of a set/reset type flip-flop, a P-MOSFET 14, two N-MOSFETs 15 and 19, two inverters 17 and 20, an AND gate 22, and a bus driver 24. The P-MOSFET 14 is connected at a gate to ground, at a source to a power supply level, and at a drain to a nodal point D. The N-MOSFET 19 is connected at a gate to the testing signal line 21 through the inverter 20, at a source to a drain of the N-MOSFET 15, and at a drain to the nodal point D. The N-MOSFET 15 is connected a t a gate to the power supply level and at a source to ground. The stand-by flag 13 is connected at a reset terminal to the nodal point D through the inverter 17, at set terminal to an output of the AND gate 22, and at an output terminal to a nodal point C through the bus driver 24. The AND gate 22 is connected at two input terminals to a writing signal line 23 and a nodal point C. The bus driver 24 is connected at a control terminal to a reading signal line 25.

Figure 6:
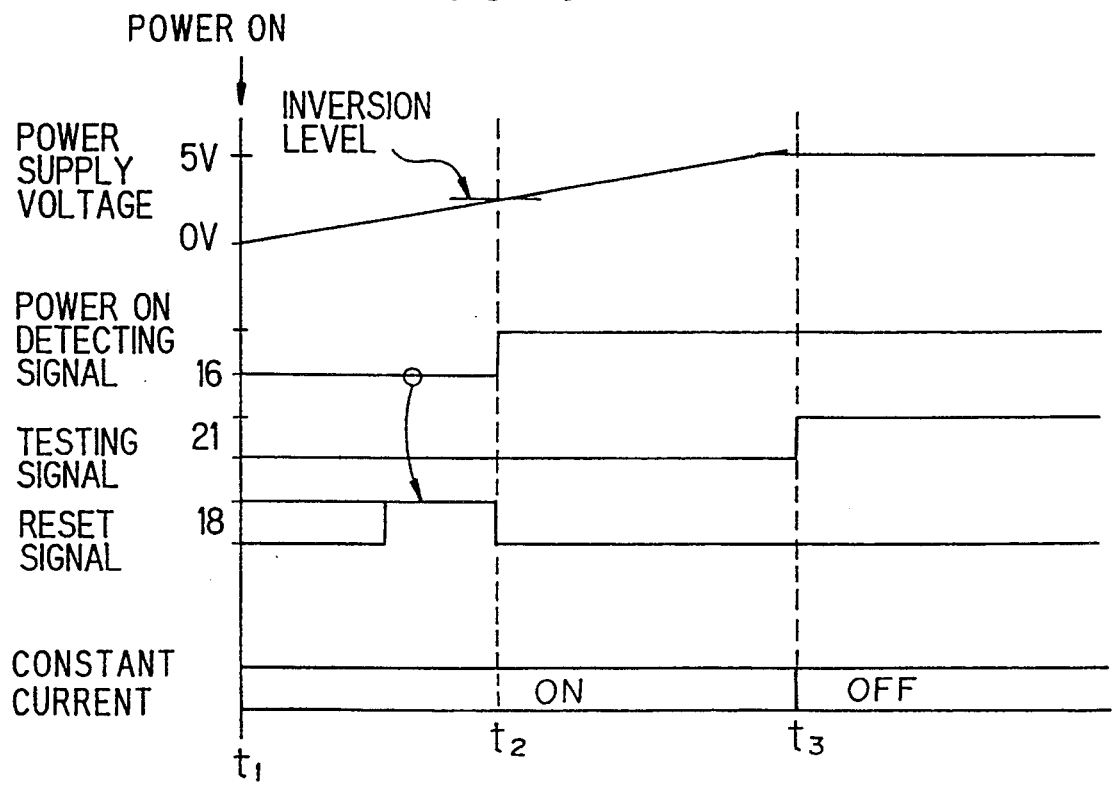
FIG. 6 is a timing chart explaining operation of the stand-by control circuit in the second preferred embodiment according to the invention.

Next, operation of the stand-by control circuit in the second preferred embodiment will be explained in conjunction with FIG. 6. In the non-testing mode, the testing signal is set to be inactive, so that the N-MOSFET 19 is applied at the gate with a high level to be in the ON state. In such a state, when the power supply is turned on (time ), the power supply voltage increases gradually, as shown in FIG. 6, and the N-MOSFET 15 is turned ON. On the other hand, the P-MOSFET 14 is constantly ON. The power ON detecting signal level which is a voltage level of the nodal point D is maintained to be a low level until the power supply voltage becomes the inversion level (time $t_2$). Therefore, the stand-by flag 13 is supplied at the reset terminal with a high level signal through the inverter 17 to be reset. When the power supply voltage increases to be the inversion level, the power detecting signal becomes a high level, so that the stand-by flag 13 is supplied at the reset terminal with a low level. On the other hand, the stand-by flag 13 is set when the AND gate 22 supplies a set signal of logic level "1" on condition that the writing signal (SPFW) 23 is active and the bus line 26 is high level. An output signal of the stand-by flag 13 is supplied to the bus line 26 through the bus driver 24 when a reading signal (SPFR) 25 supplied to the bus driver 24 becomes active.

On the other hand, when the testing signal supplied to the inverter 20 becomes high (time $t_8$), the test of LSIs is carried out. In this test, no constant current flows through the P-, N- and N-MOSFETs 14, 19 and 15, because the N-MOSFET 19 is turned off by a low level output signal of the inverter 20, while a constant current flows therethough during the times $t_1$ to $t_8$.

Although the invention has been described with respect to specific embodiments for complete and clear disclosure, the appended claims are not limited to these embodiments and alternative constructions may occur to one skilled in the art which fairly fall within the basic teaching herein set forth.

What is claimed is:

1. A stand-by control circuit for an integrated circuit device, comprising:

a power on detector for detecting a power on state of a power supply, said power on detector including a P-MOSFET, an N-MOSFET, and a NOR gate, said P-MOSFET being connected at a gate to a testing signal line, at a source to said power supply, and at a drain to a drain of said N-MOSFET, said N-MOSFET being connected at a gate to said power supply and at a source to ground, and said NOR gate being connected at two input terminals to said testing signal line and said drain of said P-MOSFET;

a flag flip-flop which is reset by a power ON detecting signal from said NOR gate; and an AND gate connected to set said flag flip-flop in response to a standby flag writing signal and a bus line signal, wherein a testing signal on said testing signal line turns said P-MOSFET OFF and prevents said NOR gate from outputting said power ON detecting signal.

2. A stand-by control circuit for an integrated circuit device, comprising:

a power on detector for detecting a power on state of a power supply, said power on detector including a P-MOSFET, first and second N-MOSFETs, and first and second inverters, said P-MOSFET being connected at a gate to ground, at a source to said power supply and at a drain to a nodal point, said first N-MOSFET being connected at a gate to an output terminal of said first inverter, at a source to a drain of said second N-MOSFET and at a drain to said nodal point, said second N-MOSFET being connected at a gate to mid power supply and at a source to ground, said first inverter being connected at an input terminal to said testing signal line, and said second inverter being connected at an input terminal to said nodal point;

a flag flip-flop which is reset by a power ON detecting signal from an output terminal of said second inverter; and an AND gate connected to set said flag flip-flop in response to a standby flag writing signal and a bus line signal, wherein a testing signal on said testing signal line is inverted by said first inverter to turn said first N-MOSFET OFF and said second inverter is prevented from outputting said power ON detecting signal.

* * * * *